(12) United States Patent
Kikuchi

(10) Patent No.: US 9,240,515 B2
(45) Date of Patent: Jan. 19, 2016

(54) METHOD OF MANUFACTURING A SOLAR CELL

(71) Applicant: E I DU PONT DE NEMOURS AND COMPANY, Wilmington, DE (US)

(72) Inventor: Chieko Kikuchi, Kanagawa (JP)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 14/534,814

(22) Filed: Nov. 6, 2014

(65) Prior Publication Data

US 2015/0144187 A1 May 28, 2015

Related U.S. Application Data

(60) Provisional application No. 61/908,226, filed on Nov. 25, 2013.

(51) Int. Cl.
*H01L 31/04* (2014.01)
*H01L 31/18* (2006.01)
*H01B 1/22* (2006.01)
*H01L 31/0216* (2014.01)
*H01L 31/0224* (2006.01)

(52) U.S. Cl.
CPC *H01L 31/18* (2013.01); *H01B 1/22* (2013.01); *H01L 31/02167* (2013.01); *H01L 31/022425* (2013.01); *H01L 31/022441* (2013.01); *H01L 31/1804* (2013.01)

(58) Field of Classification Search
None
See application file for complete search history.

(56) References Cited

U.S. PATENT DOCUMENTS

| 6,262,359 | B1 * | 7/2001 | Meier | H01L 31/022425 136/255 |
| 2012/0063943 | A1 | 3/2012 | Kang | |
| 2013/0183795 | A1 * | 7/2013 | Akimoto | H01B 1/22 438/98 |
| 2013/0192670 | A1 * | 8/2013 | Hang | C03C 8/18 136/256 |
| 2013/0273687 | A1 * | 10/2013 | Akimoto | H01L 31/022441 438/98 |
| 2015/0099326 | A1 * | 4/2015 | Hayashi | H01L 31/022425 438/98 |

FOREIGN PATENT DOCUMENTS

| CN | 102 765 720 A | 11/2012 |
| JP | 2010/267800 A | 11/2010 |
| JP | 2012/156070 A | 8/2012 |

OTHER PUBLICATIONS (PCT/US2014/066858) Search Report and Written Opinion dated Feb. 23, 2015.

* cited by examiner

*Primary Examiner* — Zandra Smith
*Assistant Examiner* — Molly Reida

(57) ABSTRACT

A method of manufacturing a solar cell comprising steps of: (a) preparing a substrate comprising a semiconductor layer and a passivation layer formed at least on the back side of the semiconductor layer, wherein the passivation layer on the back side comprises one or more openings; (b) forming an aluminum (Al) conductor pattern at least in the openings of the passivation layer on the back side by applying an Al paste, wherein the Al paste comprises: (i) an Al powder, (ii) a glass frit, (iii) a zirconium carbide (ZrC) powder, and (iv) an organic medium; and (c) firing the Al conductor pattern.

10 Claims, 2 Drawing Sheets (a)

(b)

(c)

(a)  (b)

METHOD OF MANUFACTURING A SOLAR CELL

CROSS-REFERENCE TO RELATED APPLICATION

This application claims the benefit of U.S. Provisional Application 61/908,226 filed Nov. 25, 2013.

FIELD OF THE INVENTION

The present invention relates to a solar cell, more specifically to a back side electrode on the solar cell and the method of manufacturing ft.

TECHNICAL BACKGROUND OF THE INVENTION

A solar cell having a passivation layer on the back side of a semiconductor layer such as a Passivated Emitter and Rear Cell (PERC) has been proposed.

US20130183795 discloses a method of manufacturing a back side electrode of PERC type solar cell. The method contains (a) preparing a semiconductor substrate having a passivation layer which has open-holes on the back side, (b) applying an aluminum (Al) paste comprising an Al powder, a Pb—Si—B containing glass frit, and an organic medium, and (c) firing the Al paste.

SUMMARY OF THE INVENTION

An objective is to provide a solar cell comprising a passivation layer on the back side and having high conversion efficiency.

One aspect of the present invention is a method of manufacturing a solar cell comprising the steps of: (a) preparing a substrate comprising a semiconductor layer and a passivation layer formed at least on the back side of the semiconductor layer, wherein the passivation layer on the back side comprises one or more openings; (b) forming an aluminum (Al) conductor pattern at least in the openings of the passivation layer on the back side by applying an Al paste, wherein the Al paste comprises: (i) an Al powder, (ii) a glass frit, (iii) a zirconium carbide (ZrC) powder, and (iv) an organic medium; and (c) firing the Al conductor pattern.

Another aspect of the present invention is a method of manufacturing a solar cell comprising the steps of: (a) preparing a substrate comprising a semiconductor layer and a passivation layer formed at least on the back side of the semiconductor layer; (d) forming a firing-through type pattern on the passivation layer on the back side; (b) forming an aluminum (Al) conductor pattern on the firing-through type pattern by applying an Al paste, wherein the Al paste comprises: (i) an Al powder, (ii) a glass frit, (iii) a zirconium carbide (ZrC) powder, and (iv) an organic medium; and (c) firing the firing-through type pattern and the Al conductor pattern at the same time to form an Al electrode.

Another aspect of the present invention is a method of manufacturing a solar cell comprising steps of: (a) preparing a substrate comprising a semiconductor layer and a passivation layer formed at least on the back side of the semiconductor layer; (b) forming an aluminum (Al) conductor pattern on the passivation layer on the back side by applying an Al paste, the Al paste comprises: (i) an Al powder, (ii) a glass frit, (iii) a zirconium carbide (ZrC) powder, and (iv) an organic medium; and (d) forming a firing-through type pattern on the Al conductor pattern; (c) firing the Al conductor pattern and the firing-through type pattern at the same time to form an Al electrode.

Another aspect of the present invention is a solar cell comprising a semiconductor layer, a passivation layer formed at least on the back side of the semiconductor layer, an aluminum electrode on the passivation layer, wherein the aluminum electrode locally connects to the semiconductor layer and wherein the aluminum electrode comprises zirconium carbide.

The solar cell which has sufficient efficiency can be manufactured by the present invention.

DETAILED DESCRIPTION OF THE INVENTION

The method comprises the steps of (a) preparing a substrate comprising a semiconductor layer and a passivation layer formed at least on the back side of the semiconductor layer, wherein the passivation layer on the back side comprises one or more openings, (b) forming an aluminum (Al) conductor pattern in the openings of the passivation layer on the back side by applying an Al paste, and (c) firing the Al conductor pattern, in an embodiment.

A method of making a PERC type solar cell is explained referring to FIG. 1A to 1D as an example.

Figure 1A:
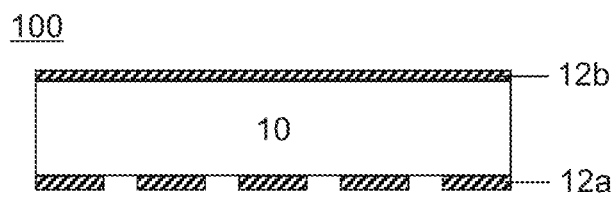
FIG. 1A to 1D explain a method of the manufacturing a solar cell.

A substrate 100 comprising a semiconductor layer 10 and a passivation layer 12*a* formed on the back side of the semiconductor layer 10 is prepared (FIG. 1A). Another passivation layer 12*b* can be formed on the front side although it's not essential. In the specification, "front side" is the light-receiving side when the solar cell is actually installed to generate electricity, and "back side" is the opposite side of the front side.

The semiconductor layer 10 can be a p-doped silicon wafer with an n-type diffusion layer formed on the front side of the p-doped silicon wafer, in an embodiment. The p-doped silicon wafer can be formed by doping boron. The n-type diffusion layer can be formed by doping phosphorus.

The passivation layer 12*a* on the back side can contribute to reduction of recombination of holes and electrons near the back side surface. The passivation layer 12*b* on the front side can also function as an anti-reflective coating (ARC) besides as the passivation layer.

The passivation layers 12*a* and 12*b* can be formed with titanium oxide, aluminum oxide, silicon nitride, silicon oxide, indium tin oxide, zinc oxide or silicon carbide. These oxides, nitrides and carbide can be applied by sputtering, plasma-enhanced chemical vapor deposition (PECVD), or a thermal CVD or plasma CVD. A multiple layer can be also available, for example, two layers of silicon nitride/silicon oxide or silicon nitride/aluminum oxide as the passivation layer 12*a* and 12*b*. The thickness of the passivation layers 12*a* and 12*b* can be 10 to 500 nm.

The passivation layer 12*a* on the back side comprises openings 14 where the passivation layer is not formed and the semiconductor layer surface is exposed. To get the openings 14 made, the passivation layer 12a can be formed through a pattern mask, or the passivation layer 12a can be ablated by a laser, for example.

Area of the openings 14 can be at least 0.001% in an embodiment, at least 0.01% in another embodiment, at least 1% in another embodiment, based on the total area of the back side surface of the semiconductor layer 10. Area of the openings 14 can be 50% or less in an embodiment, 30% or less in another embodiment, 15% or less in another embodiment, based on the total area of the back side surface of the semiconductor layer 10. In other words, at least 50% of the back side surface of the semiconductor layer 10 can be covered with the passivation layer 12 in an embodiment. By covering such an area with the passivation layer 12, recombination of holes and electrons near the back side surface can be sufficiently reduced.

For the formation of the passivation layer and the pattern of the openings, L. Gautero et al., *Comparison of different rear contacting approaches for industrial PERC solar cells on MC-Si wafe,* 25th EUPVSEC 2010-2CO.3.1, ISBN: 3-936338-26-4, Pages: 1328-1331 (2010) can be referred to.

Figure 1B:
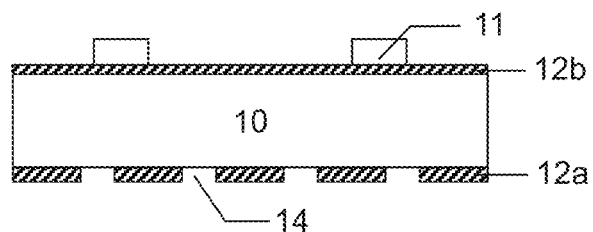

On the front side, a front electrode paste 11 can be screen-printed onto the passivation layer 12b (FIG. 1B). The front electrode paste 11 can contain essentially silver powder and a glass frit dispersed into an organic medium in an embodiment. For the front electrode paste, US20130255769, US20110232746, US20080254567 can be herein incorporated by reference.

Figure 1C:
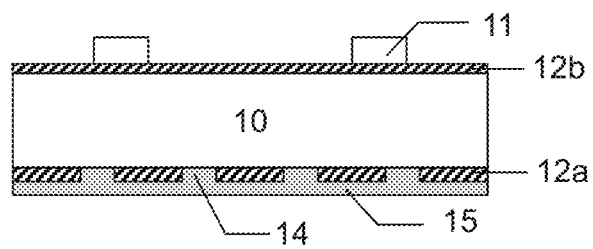

The Al conductor pattern 15 is formed at least in the openings 14. In an embodiment, the Al conductor pattern 15 is formed by applying an Al paste onto the passivation layer 12a on the back side so as to fill the openings 14. The Al conductor pattern 15 can be formed onto the entire surface of the back side of the substrate 100 so that the Al conductor pattern 15 can fill the all openings 14 (FIG. 1C). In another embodiment, the shape of the Al conductor pattern 15 can comprise dots, straight lines, circular lines, or polygonal lines as long as the Al conductor pattern 15 fills the openings 14.

The applied Al paste can be dried at 80 to 200° C. in an oven for 1 to 20 minutes. The dried Al conductor pattern 15 can have thickness of 10 to 50 μm. This drying step is not essential.

Figure 1D:
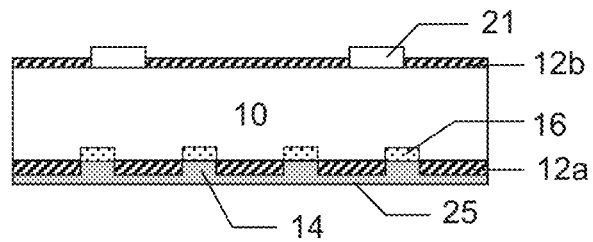

The Ai electrode 25 and the front side electrode 21 are made by firing the Al conductor pattern 15 and the front electrode paste 11 respectively (FIG. 1D). During firing, the organic medium in the pastes can be essentially removed, for example, burned out or carbonized to form the electrodes. After firing, a back surface field (BSF) 16 is formed at the area where the Al electrode 25 contacts the semiconductor layer 10 through the openings.

During the firing, the passivation layer 12a is not penetrated by the Al paste so as to stay intact to give the effect of passivation at the back side. However, it does not mean to exclude a small amount of penetration by the Al conductor pattern 15 during firing. The small amount of penetration can occur as a result of various factors such as materials of the semiconductor layer 10 and materials of the passivation layer 12a. It is acceptable that the passivation layer 12a is partially penetrated or gets thinner by the Al conductor pattern 15 as long as the passivation layer 12a remains enough to contribute to the passivation effect on the back side. The passivation layer 12a remains at least 49% of the back surface area of the semiconductor layer 10 in an embodiment.

The firing is carried out, for example in a furnace. The firing condition can be with peak setting temperature of 600 to 1000° C. for 1 second to 15 minutes in an embodiment. The firing condition can be from 400 to 600° C. for 5 seconds to 23 minutes, and over 600° C. for 3 seconds to 19 minutes in an embodiment. Total firing time can be 10 seconds to 30 minutes in an embodiment, 20 seconds to 15 minutes in another embodiment, 30 seconds to 5 minutes in another embodiment. The firing time can be counted from entrance to exit of the furnace, for example. When firing in such conditions, the electrodes can be formed with less damage to the semiconductor substrate.

The Al conductor pattern 15 becomes an Al electrode 25 after firing. The Al electrode 25 thickness can be 1 to 100 μm, for example.

In the explanation above, the Al conductor pattern 15 and the front electrode paste 11 were fired at the same time, which is called co-firing. With co-firing, the process can be shorter and simpler to reduce production cost. Alternatively, the Al conductor pattern 15 and the front electrode paste 11 can be fired separately, for example by forming and firing the Al conductor pattern 15 first, and then applying and firing the front electrode paste 11 with different firing profiles, especially when an suitable firing condition is different for each paste.

The solar cell comprises the semiconductor layer 10, a passivation layer 12a formed at least on the back side of the semiconductor layer 10, an aluminum electrode 25 on the passivation layer 12a, wherein the aluminum electrode 25 locally connects to the semiconductor layer 10 and wherein the aluminum electrode 25 comprises zirconium carbide.

Figure 2:
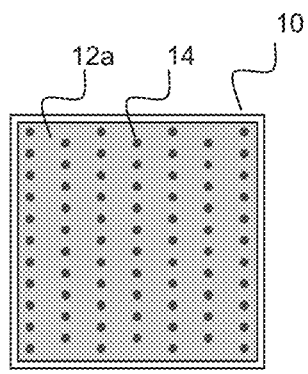
FIG. 2 (*a*) to (*c*) are rear side views of the solar cell.
Figure 2:
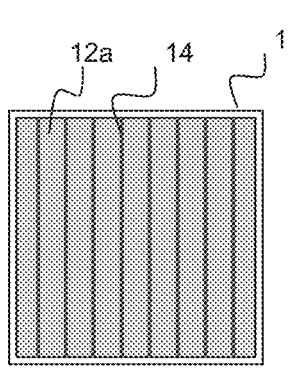
Figure 2:
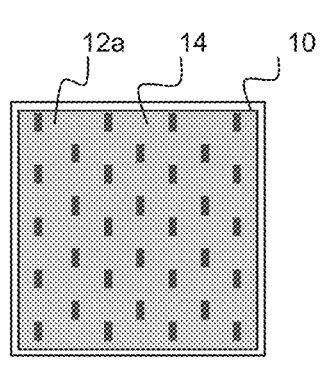

The opening 14 pattern is not limited, but it can comprise dots in a round shape as illustrated in FIG. 2 (*a*) in an embodiment. The diameter of the dots can be 10 to 400 μm, for example. The pitch between the centers of the dots can be 40 μm to 30 mm, for example. The openings 14 can comprise lines as illustrated in FIG. 2 (*b*) in another embodiment. The lines 14 can be 10 to 2000 μm wide, for example. In another embodiment, the openings 14 can comprise dashed lines as illustrated in FIG. 2 (*c*). The dashed lines can be 10 to 2000 μm wide and 0.5 to 10 mm long, for example. The size of the openings 14 can be measured by SEM, for example.

Figure 3A:
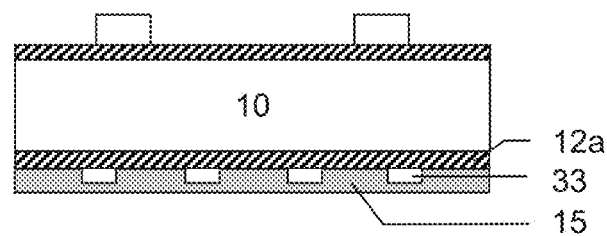
FIGS. 3A and 3B explain another method of manufacturing a solar cell.
Figure 3B:
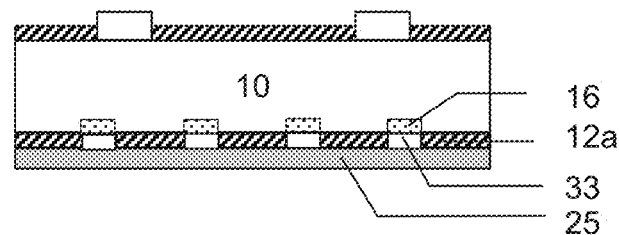

FIG. 3A shows another embodiment such that a firing-through type pattern 33 is formed instead of making the openings in the passivation layer 12a. The term "firing-through type" here means to be capable of penetrating the passivation layer 12a during firing to get electrical contact between the Al electrode 25 and the semiconductor layer 10 by the firing-through type pattern 33 itself or by combination of the firing-through type pattern 33 and the Al conductor pattern 15.

In the event of employing the firing-through type pattern 33, the method comprises steps of (a) preparing a substrate comprising a semiconductor layer and a passivation layer formed at least on the back side of the semiconductor layer, (d) forming a firing-through type pattern on the passivation layer on the back side, (b) forming an aluminum (Al) conductor pattern by applying an Al paste on the firing-through type pattern, (c) firing the firing-through type pattern and the Al conductor pattern at the same time.

In an embodiment, the firing-through type pattern 33 can be formed by applying a paste which is capable of firing through the passivation layer 12a during firing on the passivation layer 12a. The paste to form the firing-through type pattern 33 can comprise at least silver (Ag) powder in another embodiment. It's known that silver can make the fire-through in combination with aluminum. Aluminum can be derived from the Al conductor pattern 15. The paste can contain an Al powder and the Ag powder.

The paste to form the firing-through type pattern 33 can further comprise a glass frit and/or a metal oxide powder such as a zinc oxide powder in another embodiment. Some types of glass frit and metal oxide are known to help the paste penetrate the passivation layer.

For the paste to form the firing-through type pattern 33, US20080254567, US20090126797, US20100236621, US20100258165, US20130284256, US20130255769, US20060231801 can be herein incorporated by reference.

The paste to form the firing-through type pattern 33 can be same as the front electrode paste 11 that is usually capable of firing through the passivation layer 12b as shown in FIG. 1D.

The paste is applied onto the passivation layer 12a to form the firing-through type pattern 33. The way of applying the paste can be screen printing, nozzle discharge or off-set printing in an embodiment. The shape of the firing-through type pattern 33 is not limited. The shape of the openings as shown in FIG. 2 can be considered as the pattern of the firing-through type pattern 33.

In another embodiment, the firing-through type pattern 33 can be made by vapor deposition with silver. The vapor deposition can be physical vapor deposition (PVD) or chemical vapor deposition (CVD) in another embodiment. A mask having open area of a prescribed pattern for the firing-through type pattern 33 can be used at the deposition of silver.

The firing-through type pattern 33 can be dried at 80 to 200° C. in an oven for 1 to 20 minutes, although the drying step is not essential.

Next, the Al conductor pattern 15 is formed by applying an Al paste on the passivation layer 12a so as to cover the firing-though pattern 33. The way of applying the Al paste is not limited, but can be screen printing, nozzle discharge or off-set printing.

The Al conductor pattern 15 can be dried at 80 to 200° C. in an oven for 1 to 20 minutes, although the drying step is not essential.

The firing-through type pattern 33 and the Al conductor pattern 15 are fired as described above.

During the firing, an electric contact between the semiconductor layer 10 and the Al electrode 25 can be made by the firing-through type pattern 33 that penetrated the passivation layer 12a. The aluminum disperses from the Al conductor pattern 15 into the semiconductor layer 10 to form the BSF 16 through the firing-through type pattern 33.

In an embodiment, the electric contact between the semiconductor layer 10 and the Al electrode 25 by way of fire through is made only in a region where the firing-through type pattern 33 and the Al conductor pattern 15 are superimposed. Especially when the firing-through type pattern 33 penetrates the passivation layer 12a by combination with the Al conductor pattern 15, the firing-through can occur only in the area where the firing-through type pattern 33 and the Al conductor pattern 15 are overlapped and the electric contact between the semiconductor layer 10 and the Al electrode 25 is not formed by way of the firing through in a region where the firing-through type pattern 33 and the Al conductor pattern 15 are not superimposed.

For the method of using the firing-through type pattern 33 that penetrates the passivation layer 12a by combination with the Al conductor pattern 15, US20130273687 can be herein incorporated by reference.

Figure 4:
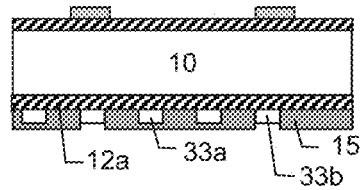
FIGS. 4 (*a*) and (*b*) are cross section views of the solar cell.
Figure 4:
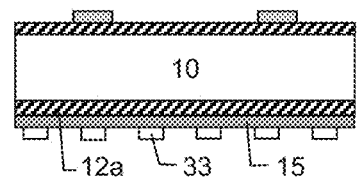

In another embodiment, the Al conductor pattern 15 can be partially applied onto the passivation layer 12a to partially cover the firing-through type pattern 33a as illustrated in FIG. 4 (a). Especially when the firing-through type pattern 33 contains silver, the firing-through type pattern can partially remain without being covered with the Al conductor pattern 15 to be used as a tab electrode 33b. The tab electrode is formed to connect solar cells by soldering a ribbon. The tab electrode containing Ag is solderable while aluminum is not.

In another embodiment, the Al conductor pattern 15 can be formed onto the passivation layer 12a and then the firing-through type pattern 33 is formed on the Al conductor pattern 15 as shown in FIG. 4 (b) in another embodiment.

In the event of forming the Al conductor pattern first, the method can comprise steps of (a) preparing a substrate comprising a semiconductor layer and a passivation layer formed at least on the back side of the semiconductor layer, (b) forming an aluminum (Al) conductor pattern on the passivation layer on the back side, (d) forming a firing-through type pattern on the Al conductor pattern; (c) firing the Al conductor pattern and the firing-through type pattern at the same time to form an Al electrode.

The embodiments above referred to PERC solar cell but the present invention can also apply to a back contact type-solar cell. The back contact type-solar cell comprises a semiconductor substrate containing a passivation layer at least on the back side and a back side electrode which is formed only on the back side of the semiconductor substrate. US20100170562 can be herein incorporated by reference for the back contact type-solar cell.

The Al paste is explained in detail below. The aluminum paste comprises (i) an aluminum powder, (ii) a glass frit, (iii) a zirconium carbide powder and (iv) an organic medium.

(i) Aluminum Powder

The aluminum (Al) powder is a metal powder to transport electrical current in the Al electrode.

The Al powder can be 30 to 80 weight percent (wt. %) in an embodiment, 55 to 78 wt. % in another embodiment, and 63 to 75 wt. % in another embodiment, based on the weight of the Al paste. With such content of Al powder, the Al electrode can have sufficient conductivity.

In an embodiment, the Al powder can be flaky, nodular or spherical in shape.

Particle diameter (D50) of the Al powder can be 0.1 to 20 μm in an embodiment, 2 to 15 μm in another embodiment, and 5 to 10 μm in another embodiment. Al powder with such particle diameter can be adequately dispersed in an organic medium. The particle diameter (D50) is obtained by measuring the distribution of the particle diameters by using a laser diffraction scattering method. The median ($50^{th}$ percentile) of the particle size distribution as measured by volume is defined as D50. Microtrac model X-100 is an example of the commercially-available devices that can be used to make this measurement.

Purity of the Al powder can be at least 90% in an embodiment, at least 95% in another embodiment, and at least 97% in another embodiment. The surface of the Al powder sometimes can be oxidized.

In an embodiment, the Al paste contains no silver. However, it is to acceptable to contain silver powder in a contamination level, for example 0.001 to 1 parts by weight when the Al powder is 100 parts by weight in the Al paste. The addition of this much of silver powder can hardly cause fire-through.

(ii) Glass Frit

The glass frit is used as an inorganic binder. When firing the Al paste, the glass frit melts to bind Al powder and help the electrode adhere to the substrate.

The content of the glass frit composition is expressed herein with cation mol percent (%) unless it is otherwise described. "Cation mol %" is defined as mol % of a cationic component based on the total mole of cationic components in the glass frit. The non-metal component such as hydrogen ion ($H^+$) and oxonium ion ($H_3O^+$) are not counted as cationic components.

The glass frit comprises at least 30 to 70 cation mole % of lead ($Pb^{2+}$), 10 to 65 cation mole % of boron ($B^{3+}$), 1 to 40 cation mole % of silicon ($Si^{4+}$), and 1 to 25 cation mole % of aluminum ($Al^{3+}$), based on the total mole of cationic components in the glass frit in an embodiment.

$Pb^{2+}$ can be 32 to 62 cation mol % in another embodiment, 34 to 54 cation mol % in another embodiment, and 35 to 45 cation mol % in still another embodiment, wherein the cation mol % is based on the total mole of cationic components in the glass frit.

$B^{3+}$ can be 15 to 60 cation mol % in another embodiment, 23 to 55 cation mol % in another embodiment, and 32 to 50 cation mol % in still another embodiment, wherein the cation mol % is based on the total mole of cationic components in the glass frit.

$Si^{4+}$ can be 3 to 35 cation mol % in another embodiment, 6 to 31 cation mol % in another embodiment, and 8 to 25 cation mol % in still another embodiment, wherein the cation mol % is based on the total mole of cationic components in the glass frit.

$Al^{3+}$ can be 1 to 20 cation mol % in an embodiment, 1.5 to 16 cation mol % in another embodiment, and 2 to 13 cation mol % in still another embodiment, wherein the cation mol % is based on the total mole of cationic components in the glass frit.

With these glass frit compositions, the back side electrode will have sufficient adhesion.

These cationic components of $Pb^{2+}$, $Si^{4+}$, $B^{3+}$ or $Al^{3+}$ can be introduced into the glass frit as starting materials in the form of oxides, fluorides or hydroxides.

The starting material of $Pb^{2+}$ can be lead(II) oxide (PbO), lead dioxide ($PbO_2$), trilead tetraoxide ($Pb_3O_4$) or lead difluoride ($PbF_2$); $Si^{4+}$ can be silicon dioxide ($SiO_2$), or silicon tetrafluoride ($SiF_4$); $B^{3+}$ can be diboron trioxide ($B_2O_3$), boric acid ($H_3BO_3$), boron phosphate ($BPO_4$) or boron trifluoride ($BF_3$); $Al^{3+}$ can be aluminum(III) oxide ($Al_2O_3$), aluminum hydroxide ($Al(OH)_3$) or aluminum fluoride ($AlF_3$).

PbO as the starting material of $Pb^{2+}$ can be 60 to 93 weight percent (wt. %) in an embodiment, 65 to 87 wt. % in another embodiment, 70 to 83 wt. % in another embodiment, wherein the wt. % is based on the weight of the glass frit.

$B_2O_3$ as the starting material of $B^{3+}$ can be 5 to 30 wt. % in an to embodiment, 7 to 23 wt. % in another embodiment, 9 to 19 wt. % in another embodiment, wherein the wt. % is based on the weight of the glass frit.

$SiO_2$ as the starting material of $Sr^+$ can be 1 to 15 wt, % in an embodiment, 2 to 11 wt. % in another embodiment, 3 to 8 wt. % in another embodiment, wherein the wt. % is based on the weight of the glass frit.

$Al_2O_3$ as the starting material of $Al^{3+}$ can be 1 to 15 wt. % in an embodiment, 2 to 11 wt. % in another embodiment, 3 to 7 wt. % in another embodiment, wherein the wt. % is based on the weight of the glass frit.

Softening point of the glass frit can be 300 to 600° C. in an embodiment, 310 to 550° C. in another embodiment, 320 to 490° C. in another embodiment. When the softening point is in these ranges, glass frit can melt properly at a relatively low firing temperature. Here, "softening point" is measured by the fiber elongation method of ASTM 0338-57.

The glass frit can be 0.1 to 10 parts by weight in an embodiment, 0.2 to 7 parts by weight in another embodiment, and 0.3 to 4 parts by weight in still another embodiment, when the Al powder is 100 parts by weight in the Al paste. When the Al paste contains such amounts of the glass frit, the Al electrode can firmly adhere to the substrate.

Particle diameter (D50) of the glass frit can be 0.1 to 5 μm in an embodiment, 0.3 to 3 μm in another embodiment, and 0.5 to 2 μm in still another embodiment. With such particle diameters, the glass frit can melt properly to bind Al powder. The particle diameter D50 can be determined as described above for the Al powder.

For the glass frit, US20130192670 and US20110120535 can be can be herein incorporated by reference.

(iii) Zirconium Carbide Powder

The zirconium carbide (ZrC) is an inorganic compound of zirconium and carbon having molecular weight of 103.2 g/mol, melting point of 3532° C. and cubic crystal structure.

The scope of the invention is not limited by theories, but it is assumed that the Al paste give less damage on the passivation layer by being added the ZrC powder. With the less damaged passivation layer on the back side, the solar cell gets more passivation effects to improve the electrical property.

The purity of the ZrC powder can be 85% or more in an embodiment, 92% or more in another embodiment.

The ZrC powder is at least 0.01 parts by weight in an embodiment, at least 0.5 parts by weight in another embodiment, at least 0.2 parts by weight in another embodiment, at least 0.5 parts by weight in another embodiment, when the Al powder is 100 parts by weight in the Al paste. The ZrC powder is 5 parts by weight or less in an embodiment, 3.5 parts by weight or less in another embodiment, 2.0 parts by weight or less in another embodiment when the Al powder is 100 parts by weight in the Al paste. The Al paste containing such amount of ZrC powder can contribute to enhance the electrical property of the solar cell as shown in Example below.

There is no limitation on the shape of the ZrC powder. The ZrC powder can be of any shape, for example flaked, spherical, nodular or a mixture of these.

Particle diameter of the ZrC powder is not restricted. The Particle diameter t can be 0.1 to 15 μm in an embodiment, 0.8 to 8 μm in another embodiment, and 1.5 to 5 μm in another embodiment. The particle diameter D50 can be determined as described above for the Al powder.

(iii) Organic Medium

The organic medium is used as an organic binder. The organic medium in which the inorganic components such as the conductive powder and the glass frit are dispersed forms a "paste", having suitable viscosity for applying on a substrate.

The organic medium can contain an organic polymer and optionally a solvent. A wide variety of inert viscous materials can be used as an organic medium. In an embodiment, the organic polymer can comprise ethyl cellulose, ethylhydroxyethyl cellulose, wood rosin, phenolic resin, polymethacrylate of lower alcohol, or monobutyl ether of ethylene glycol monoacetate. When adding a solvent to the organic medium, the solvent can comprise texanol, ester alcohol, terpineol, kerosene, dibutylphthalate, butyl carbitol, butyl carbitol acetate, hexylene glycol or high boiling alcohols. The solvent is chosen in view of the organic polymer solubility. In an embodiment, the organic medium can be a mixture of ethyl cellulose and texanol.

The organic medium can be 10 to 70 parts by weight in an embodiment, 15 to 66 parts by weight in another embodiment, and 20 to 59 parts by weight in still another embodiment, when the Al powder is 100 parts by weight in the Al paste.

(iv) Additives

Thickener, stabilizer, viscosity modifier or surfactant can be optionally added to the Al paste. Other common additives such as a dispersant, viscosity-adjusting agent, and so on can also be added. The amount of the additive depends on the desired characteristics of the resulting electrically conducting paste. Multiple types of additives can be used.

EXAMPLES

The present invention is illustrated by, but is not limited to, the following examples.

An aluminum paste was prepared by the following materials and a procedure. Amounts of the materials in each example are shown in Table 1.

Aluminum (Al) powder: a spherical shape of the Al powder was used. The particle diameter (D50) was 7.5 μm. The Al purity was 99.5%.

ZrC powder: a nodular shape of ZrC powder (ZRI03PB, Kojundo Chemical Laboratory Company, CAS number is 12070-14-3) was used. The particle diameter was 2.0 μm. The purity of ZrC powder was 95%.

Glass frit: a Pb—Si—B glass frit with softening point (Ts) of 415° C. was used.

Organic medium: A mixture of ethyl cellulose and texanol was used.

The Al powder, the ZrC powder and the glass frit were dispersed in the organic medium and mixed for 30 minutes to form an Al paste. The Al paste was repeatedly passed through a three-roll mill at progressively increasing pressures from 0 to 400 psi. The gap of the rolls was adjusted to 1 mil.

The viscosity as measured with Brookfield HBT viscometer with #14 spindle at 10 rpm and 25° C. was between 30 and 60 Pass. The degree of dispersion as measured by fineness of grind was 15/5 or less.

A p-doped silicon wafer with an n-type diffusion layer on its front side was prepared. The silicon wafer had the passivation layers with no opening on both the front side and the back side.

The firing-through type pattern was shaped by screen printing an Ag paste (PV51M, E. I. DuPont de Nemours and Company) on the backside passivation layer through a screen mask. The screen mask had a pattern consisting of rectangle shape of holes 80 μm long and 60 μm wide with pitch of 500 μm between the centers of the rectangles. The Ag paste was dried at 150° C. for 5 minutes.

The Al conductor pattern was shaped by screen printing the Al paste prepared above onto the entire surface of the backside passivation layer so as to cover up the firing-through type pattern of the Ag paste. The Al conductor pattern was dried at 150° C. for 5 minutes.

The area where the firing-through type pattern and the Al conductor pattern were superimposed was 2.9% based on the back surface area of the silicon wafer.

Another Ag paste (PV17F, E. I. DuPont de Nemours and Company) was screen-printed on the ARC on the front side with a line pattern. The Ag paste was dried at 150° C. for 5 minutes.

A solar cell was obtained by firing the pastes in a furnace (CF-7210, Despatch industry) at peak temperature setting with 905° C. Firing time from furnace entrance to exit was 60 seconds. The firing condition was 400 to 600° C. for 12 seconds, and over 600° C. for 6 seconds. The belt speed of the furnace was 550 cpm.

Thickness of the Al electrode was 15 μm.

Conversion efficiency (Eff) of the solar cell was evaluated by using a cell tester NCT-M-150AA manufactured by NPC Corporation.

The Eff in each Example was shown in Table 1 as the difference from the Eff in comparative (Com) example 1. The Eff increased in all Example 1 to 3 where the Al paste contained the ZrC powder.

TABLE 1

| | | | | (parts by weight) |
|---|---|---|---|---|
| | Com. Example 1 | Example 1 | Example 2 | Example 3 |
| Al powder | 100 | 100 | 100 | 100 |
| Pb—Si—B glass frit | 2.08 | 2.08 | 2.08 | 2.08 |
| ZrC powder | 0.00 | 0.35 | 0.91 | 1.93 |
| Organic medium | 36.81 | 39.29 | 43.20 | 50.31 |
| EFF (%) | 100 | +0.3 | +0.2 | +0.3 |

Note:
the compositions in the table are displayed as parts by weight.
Effs (%) is shown as the differences from the Eff in Com. Example 1 where the Al paste contained no ZrC powder.

The solar cell was made in the same manner as Example 1 except for using a different Al paste composition as shown in Table 2. The glass frit had Ts of 336° C.

The Eff was measured as described above for Example 1. The Eff increased in example 4 to 5 where the Al paste contained the ZrC powder compare to the Eff in comparative example 2 where the Al paste contained no ZrC powder as shown in Table 2.

TABLE 2

| | | | (parts by weight) |
|---|---|---|---|
| | Comparative Example 2 | Example 4 | Example 5 |
| Al powder | 100 | 100 | 100 |
| Pb—Si—B glass frit | 0.83 | 0.83 | 0.83 |
| ZrC powder | 0.00 | 0.07 | 0.14 |
| Organic medium | 38.06 | 37.99 | 37.92 |
| EFF (%) | 0 | +0.1 | +0.1 |

Note:
the compositions in the table are displayed as parts by weight.
Effs (%) is shown as the differences from the Eff in Com. Example 1 where the Al paste contained no ZrC powder.

Next, other metal carbide was examined. The solar cell was made in the same manner as Example 1 except for using a different Al paste composition. The Al paste contained 100 parts by weight of the Al powder, 2.1 parts by weight of the glass frit, 1.4 parts by weight of the metal carbide powder, and 48.5 parts by weight of the organic medium. The metal carbide powder was respectively titanium carbide (TC) powder, molybdenum carbide ($Mo_2C$) powder, tantalum carbide (TaC) powder, tungsten carbide (WC) powder, niobium carbide (NbC) powder or vanadium carbide (VC) powder as shown in Table 3.

For evaluation, the solar cell that employed the Al paste contained no metal carbide was made as Comparative Example 2.

The Eff of the solar cell was shown in Table 3 as the difference from comparative example 3. In comparative example 4 to 9 showed lower Eff than the comparative example 3 where the Al paste contained no metal carbide.

TABLE 3

| | Com. Example 3 | Com. Example 4 | Com. Example 5 | Com. Example 6 | Com. Example 7 | Com. Example 8 | Com. Example 9 |
|---|---|---|---|---|---|---|---|
| Metal carbide powder | None | TiC | $Mo_2C$ | TaC | WC | NbC | VC |
| EFF (%) | 0 | −0.3 | −0.7 | −0.3 | −0.5 | −0.9 | −1.5 |

Note:
Effs (%) is shown as difference from the Eff in Comparative Example 2 where the Al paste contained no metal carbide powder.

I claim:

1. A method of manufacturing a solar cell comprising steps of:
   (a) preparing a substrate comprising a semiconductor layer and a passivation layer formed at least on the back side of the semiconductor layer, wherein the passivation layer on the back side comprises one or more openings;
   (b) forming an aluminum (Al) conductor pattern at least in the openings of the passivation layer on the back side by applying an Al paste, wherein the Al paste comprises:
      (i) an Al powder,
      (ii) a glass frit,
      (iii) a zirconium carbide (ZrC) powder, and
      (iv) an organic medium; and
   (c) firing the Al conductor pattern.

2. The method of claim 1, wherein the ZrC powder is 0.01 to 5 parts by weight, when the Al powder is 100 parts by weight in the Al paste.

3. The method of claim 1, wherein the passivation layer is formed with titanium oxide, aluminum oxide, silicon nitride, silicon oxide, indium tin oxide, zinc oxide or silicon carbide.

4. A method of manufacturing a solar cell comprising steps of:
   (a) preparing a substrate comprising a semiconductor layer and a passivation layer formed at least on the back side of the semiconductor layer;
   (d) forming a firing-through type pattern on the passivation layer on the back side;
   (b) forming an aluminum (Al) conductor pattern on the firing-through type pattern by applying an Al paste, wherein the Al paste comprises:
      (i) an Al powder,
      (ii) a glass frit,
      (iii) a zirconium carbide (ZrC) powder, and
      (iv) an organic medium; and
   (c) firing the firing-through type pattern and the Al conductor pattern at the same time to form an Al electrode.

5. The method of claim 4, wherein electric contact between the semiconductor layer and the Al electrode by way of fire through is made only in a region where the firing-through type pattern and the Al conductor pattern are superimposed.

6. The method of claim 4, wherein the ZrC powder is 0.01 to 5 parts by weight when the Al powder is 100 parts by weight in the Al paste.

7. A method of manufacturing a solar cell comprising steps of:
   (a) preparing a substrate comprising a semiconductor layer and a passivation layer formed at least on the back side of the semiconductor layer;
   (b) forming an aluminum (Al) conductor pattern on the passivation layer on the back side by applying an Al paste, the Al paste comprises:
      (i) an Al powder,
      (ii) a glass frit,
      (iii) a zirconium carbide (ZrC) powder, and
      (iv) an organic medium; and
   (d) forming a firing-through type pattern on the Al conductor pattern;
   (c) firing the Al conductor pattern and the firing-through type pattern at the same time to form an Al electrode.

8. The method of claim 7, wherein the electric contact between the semiconductor layer and the Al electrode by way of fire through is made only in a region where the firing-through type pattern and the Al conductor pattern are superimposed.

9. The method of claim 7, wherein the ZrC powder is 0.01 to 5 parts by weight when the Al powder is 100 parts by weight in the Al paste.

10. A solar cell comprising a semiconductor layer, a passivation layer formed at least on the back side of the semiconductor layer, an aluminum electrode on the passivation layer, wherein the aluminum electrode locally connects to the semiconductor layer and wherein the aluminum electrode comprises zirconium carbide.

* * * * *

UNITED STATES PATENT AND TRADEMARK OFFICE
CERTIFICATE OF CORRECTION

PATENT NO.          : 9,240,515 B2
APPLICATION NO.     : 14/534814
DATED               : January 19, 2016
INVENTOR(S)         : Chieko Kikuchi Page 1 of 1

It is certified that error appears in the above-identified patent and that said Letters Patent is hereby corrected as shown below:

Claims

Claim 4, Column 11, Line 27, Please change "(d)" to read --(b)--.

Claim 4, Column 11, Line 29, Please change "(b)" to read --(c)--.

Claim 4, Column 11, Line 36, Please change "(c)" to read --(d)--.

Claim 7, Column 12, Line 19, Please change "(d)" to read --(c)--.

Claim 7, Column 12, Line 27, Please change "(c)" to read --(d)--.

Signed and Sealed this
Twenty-eighth Day of June, 2016

Michelle K. Lee
*Director of the United States Patent and Trademark Office*